(12) United States Patent
Huang

(10) Patent No.: US 11,791,414 B2
(45) Date of Patent: Oct. 17, 2023

(54) TFT DEVICE, MANUFACTURING METHOD THEREOF, AND ARRAY SUBSTRATE

(71) Applicant: Wuhan China Star Optoelectronics Technology Co., Ltd., Hubei (CN)

(72) Inventor: Jianlong Huang, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 437 days.

(21) Appl. No.: 17/254,967

(22) PCT Filed: Sep. 23, 2020

(86) PCT No.: PCT/CN2020/117054
§ 371 (c)(1),
(2) Date: Dec. 22, 2020

(87) PCT Pub. No.: WO2022/041367
PCT Pub. Date: Mar. 3, 2022

(65) Prior Publication Data
US 2022/0320344 A1    Oct. 6, 2022

(30) Foreign Application Priority Data
Aug. 31, 2020   (CN) .......................... 202010896304.6

(51) Int. Cl.
*H01L 29/786* (2006.01)
*H01L 29/66* (2006.01)

(52) U.S. Cl.
CPC .. *H01L 29/78633* (2013.01); *H01L 29/66742* (2013.01); *H01L 29/78618* (2013.01)

(58) Field of Classification Search
CPC ......... H01L 29/78633; H01L 29/66742; H01L 29/78618; H01L 27/1225; H01L 29/7869;
(Continued)

(56) References Cited

U.S. PATENT DOCUMENTS

2007/0159565 A1* 7/2007 Segawa ............. G02F 1/136209
257/E27.113
2012/0153289 A1* 6/2012 Kaneko ............. H01L 29/78633
257/E33.012
(Continued)

FOREIGN PATENT DOCUMENTS

CN        1452250      10/2003
CN        101051643    10/2007
(Continued)

*Primary Examiner* — Tong-Ho Kim

(57) ABSTRACT

The embodiments of the present invention provide a thin film transistor (TFT) device, a manufacturing method thereof, and an array substrate. A gate electrode comprises a first sub-gate electrode and a second sub-gate electrode disposed on different layers. The first sub-gate electrode is located between the active layer, the source electrode, and the drain electrode in a film thickness direction of the TFT device. The second sub-gate electrode, the source electrode, and the drain electrode are disposed on a same layer. The second sub-gate electrode comprises two gate electrode metal patterns. The two gate electrode metal patterns are spaced apart and electrically connected to a same scan line and simultaneously charge the first sub-gate electrode.

18 Claims, 8 Drawing Sheets

(58) Field of Classification Search
CPC ......... H01L 29/42384; H01L 29/78645; H01L 29/42376; H01L 29/4238; H01L 29/4908; H01L 29/495; H01L 29/66969; G02F 1/1368
USPC ........................................................ 257/288
See application file for complete search history.

(56) References Cited

U.S. PATENT DOCUMENTS

2018/0053836 A1* 2/2018 Jang .................... H10K 10/466
2018/0061860 A1   3/2018 Kim et al.
2021/0134848 A1   5/2021 Hanada et al.

FOREIGN PATENT DOCUMENTS

| CN | 104218091 | 12/2014 |
| CN | 107104108 | 8/2017 |
| CN | 109148597 | 1/2019 |
| CN | 109300917 | 2/2019 |
| CN | 110993651 | 4/2020 |
| JP | 2000-315795 | 11/2000 |
| WO | WO 2020/0218939 | 1/2020 |

* cited by examiner

TFT DEVICE, MANUFACTURING METHOD THEREOF, AND ARRAY SUBSTRATE

RELATED APPLICATIONS

This application is a National Phase of PCT Patent Application No. PCT/CN2020/117054 having International filing date of Sep. 23, 2020, which claims the benefit of priority of Chinese Patent Application No. 202010896304.6 filed on Aug. 31, 2020. The contents of the above applications are all incorporated by reference as if fully set forth herein in their entirety.

FIELD AND BACKGROUND OF THE INVENTION

The present invention relates to the field of manufacturing technology of a display panel, and in particular, to a thin film transistor (TFT) device, a manufacturing method thereof, and an array substrate.

Thin film transistors (TFTs) are important components of a flat display device, they can be formed on a glass substrate or a plastic substrate, and are normally used as a switching device and a driving device in display devices, such as a liquid crystal display (LCD) device or an organic light emitting display (OLED) device. TFTs have a variety of structures. In a TFT with a traditional bottom-gate electrode structure, due to a large overlapping area between a gate electrode and source/drain electrodes, large stray capacitance is generated, leading to delay of signals and a large size of the manufactured TFT. Therefore, its application is limited. In a TFT with a top-gate electrode structure, since a gate electrode does not overlap source/drain electrodes, it has lower stray capacitance and better ductility, and it reduces delay during signal transmission. In addition, a self-alignment manufacturing method is used, which is beneficial to manufacture a short channel component and improves stability of a component. Therefore, TFTs with the top-gate electrode structure have become a main development direction.

As shown in FIG. 1, a top-gate TFT 100 in the prior art comprises a light shield layer 102, a buffer layer 103, an active layer 104, a gate insulation layer 105, a gate electrode 106, an interlayer insulation layer 107, a source electrode 1081, a drain electrode 1082, a planarization layer 1083, a common electrode 1091, a passivation layer 109, and a pixel electrode 1092 laminated successively on a substrate 101 from bottom to top. The source electrode 1081 and the drain electrode 1082 are respectively connected to a source doped region 1041 and a drain doped region 1042 of the active layer 104 through via holes defined in the interlayer insulation layer 107. The buffer layer 103 comprises a silicon nitride layer 1031 and a silicon oxide layer 1032, and a channel region 1043 is disposed between the source doped region 1041 and the drain doped region 1042. Resolution, refresh rate, frequency, and size requirements of liquid crystal panels are getting higher and higher. In a relatively short period of time, a surface of the gate electrode 106 is covered with a certain charge, which generates an electric field in the channel region 1043 to make electrons and holes between the source doped region 1041 and the drain doped region 1042 undergo directional movements, which realizes a rapid application of data signals to pixels, improves frame rate switching and refresh of the liquid crystal panel, and displays complex images. In order to increase charging rate of the top-gate TFT 100, the gate electrode 106 of the top-gate TFT 100 is made of molybdenum, and a thickness and width of the gate electrode 106 are increased to reduce an impedance of the gate electrode 106, which can improve charging rate to a certain extent. However, the increase of the films easily leads to an increase of stress on the films, and thus there is a risk of fragmentation. In addition, the width of the gate electrode 106 is also affected by a pixel aperture ratio and cannot keep increasing. Furthermore, the gate electrode 106 is made of metal such as aluminum. Thus, after the gate electrode 106 is completed, the prepared interlayer insulation layer 107 needs to be supplemented with hydrogen at a high temperature, and the high temperature is likely to damage the aluminum gate electrode, which affects a quality of the top-gate TFT 100.

In summary, it is necessary to design a TFT with a new structure to solve the above-mentioned technical problems: increasing the thickness and width of the gate electrode in the top-gate TFT to improve charging rate can easily increase stress on the TFT films, which leads to a fragmentation of the films; the pixel aperture ratio limits the width of the gate electrode, and thus the width cannot keep increasing; in addition, the gate electrode is replaced with aluminum from molybdenum, and thus in the subsequent manufacturing process, a high temperature easily damages the aluminum gate electrode.

The embodiments of the present invention provides a TFT device, a manufacturing method thereof, and an array substrate, which can solve the above technical problems: increasing the thickness and width of the gate electrode in the top-gate TFT to improve charging rate can easily increase stress on the TFT films, which leads to a fragmentation of the films; the pixel aperture ratio limits the width of the gate electrode, and thus the width cannot keep increasing; in addition, the gate electrode is replaced with aluminum from molybdenum, and thus in the subsequent manufacturing process, a high temperature easily damages the aluminum gate electrode.

SUMMARY OF THE INVENTION

To solve the above problems, the technical solutions provided by the present invention are as follows:

The embodiments of the present invention provide a TFT device, the TFT device at least comprises a light shield layer, an active layer, a gate electrode, a source electrode, and a drain electrode, the gate electrode comprises a first sub-gate electrode and a second sub-gate electrode disposed on different layers, the first sub-gate electrode is defined between the active layer and the source electrode as well as the drain electrode in a film thickness direction of the TFT device, and the first sub-gate electrode and the second sub-gate electrode are electrically connected.

According to a preferred embodiment of the present invention, the active layer is a U-shape, the active layer comprises a source doped region, a drain doped region, and a channel region defined between the source doped region and the drain doped region, the source doped region and the drain doped region are disposed at two ends of the U-shape, and the first sub-gate electrode covers a middle portion of the U-shape and does not cover a lower portion of the U-shape.

According to a preferred embodiment of the present invention, in the film thickness direction of the TFT device, the source electrode overlaps one end of the U-shape, the drain electrode overlaps another end of the U-shape, the source electrode and the source doped region are electrically connected through a source contact hole, and the drain electrode and the drain doped region are electrically connected through a drain contact hole.

According to a preferred embodiment of the present invention, the second sub-gate electrode comprises at least one gate electrode metal pattern, the second sub-gate electrode, the source electrode, and the drain electrode are disposed on a same layer, and the gate electrode metal pattern is electrically connected to a surface or a side surface of the first sub-gate electrode by a via hole.

According to a preferred embodiment of the present invention, the second sub-gate electrode comprises two gate electrode metal patterns, and the two gate electrode metal patterns are spaced apart and defined at two sides of the U-shape.

According to a preferred embodiment of the present invention, the two gate electrode metal patterns are electrically connected to a same scan line by via holes and simultaneously charge the first sub-gate electrode, and when a side of the first sub-gate electrode near the active layer is attached with a preset charge, the preset charge generates a preset electric field to drive electrons and holes in the channel region to move along preset directions.

According to a preferred embodiment of the present invention, the first sub-gate electrode is one or more composite materials of molybdenum, copper, chromium, tungsten, tantalum, and titanium, and the second sub-gate electrode is aluminum or an aluminum alloy.

According to a preferred embodiment of the present invention, in the film thickness direction of the TFT device, the first sub-gate electrode is defined within the light shield layer, and materials of the first sub-gate electrode and the light shield layer are same.

According to a preferred embodiment of the present invention, a planarization layer is disposed on the source electrode and the drain electrode, a common electrode and a passivation layer covering the common electrode are disposed on a surface of the planarization layer, a pixel electrode is disposed on a surface of the passivation layer, and the pixel electrode is electrically connected to the drain electrode through a pixel hole.

According to a preferred embodiment of the present invention, the second sub-gate electrode is disposed on a same layer with the common electrode or the pixel electrode.

According to the above mentioned TFT device, the present invention further provides a manufacturing method of a TFT device, comprising steps of:

a step S10: providing a substrate, forming a light shield layer on the substrate, forming a buffer layer on the substrate, and forming an active layer corresponding to an upward side of the light shield layer on the buffer layer; and a step S20: forming a gate insulation layer on the buffer layer, forming a first sub-gate electrode corresponding to an upward side of the active layer on the gate insulation layer, forming an interlayer insulation layer on the gate insulation layer, and forming a second sub-gate electrode corresponding to an upward side of the first sub-gate electrode, a source electrode, and a drain electrode on the interlayer insulation layer, wherein the first sub-gate electrode and the second sub-gate electrode are electrically connected.

According to a preferred embodiment of the present invention, the step S20 further comprises:
the second sub-gate electrode comprises two gate electrode metal patterns, and the two gate electrode metal patterns are spaced apart and electrically connected to the first sub-gate electrode by via holes in the interlayer insulation layer, wherein the first sub-gate electrode is one or more composite materials of molybdenum, copper, chromium, tungsten, tantalum, and titanium, and the two gate electrode metal patterns are aluminum or aluminum alloys.

According to the above mentioned TFT device, the present invention further provides an array substrate, comprising a TFT device, wherein the TFT device at least comprises a light shield layer, an active layer, a gate electrode, a source electrode, and a drain electrode, wherein the gate electrode comprises a first sub-gate electrode and a second sub-gate electrode disposed on different layers, the first sub-gate electrode is defined between the active layer and the source electrode as well as the drain electrode in a film thickness direction of the TFT device, and the first sub-gate electrode and the second sub-gate electrode are electrically connected; and the active layer is a U-shape, the active layer comprises a source doped region, a drain doped region, and a channel region defined between the source doped region and the drain doped region, the source doped region and the drain doped region are disposed at two ends of the U-shape, and the first sub-gate electrode covers a middle portion of the U-shape and does not cover a lower portion of the U-shape.

According to a preferred embodiment of the present invention, in the film thickness direction of the TFT device, the source electrode overlaps one end of the U-shape, the drain electrode overlaps another end of the U-shape, the source electrode and the source doped region are electrically connected through a source contact hole, and the drain electrode and the drain doped region are electrically connected through a drain contact hole.

According to a preferred embodiment of the present invention, the second sub-gate electrode comprises at least one gate electrode metal pattern, the second sub-gate electrode, the source electrode, and the drain electrode are disposed on a same layer, and the gate electrode metal pattern is electrically connected to a surface or a side surface of the first sub-gate electrode by a via hole.

According to a preferred embodiment of the present invention, the second sub-gate electrode comprises two gate electrode metal patterns, and the two gate electrode metal patterns are spaced apart and defined at two sides of the U-shape.

According to a preferred embodiment of the present invention, the two gate electrode metal patterns are electrically connected to a same scan line by via holes and simultaneously charge the first sub-gate electrode, and when a side of the first sub-gate electrode near the active layer is attached with a preset charge, the preset charge generates a preset electric field to drive electrons and holes in the channel region to move along preset directions.

According to a preferred embodiment of the present invention, the first sub-gate electrode is one or more composite materials of molybdenum, copper, chromium, tungsten, tantalum, and titanium, and the second sub-gate electrode is aluminum or an aluminum alloy.

According to a preferred embodiment of the present invention, in the film thickness direction of the TFT device, the first sub-gate electrode is defined within the light shield layer, and materials of the first sub-gate electrode and the light shield layer are same.

According to a preferred embodiment of the present invention, a planarization layer is disposed on the source electrode and the drain electrode, a common electrode and a passivation layer covering the common electrode are disposed on a surface of the planarization layer, a pixel electrode is disposed on a surface of the passivation layer, and the pixel electrode is electrically connected to the drain electrode through a pixel hole.

The present invention provides a TFT device, a manufacturing method thereof, and an array substrate. The gate electrode comprises a first sub-gate electrode and a second sub-gate electrode disposed on different layers, the first sub-gate electrode is located between the active layer and the source electrode as well as the drain electrode in a film thickness direction of the TFT device, the second sub-gate electrode, the source electrode, and the drain electrode are disposed on a same layer, and prepared in a same mask, which can save a mask. The second sub-gate electrode is not affected by the opening of the pixel unit. The second sub-gate electrode comprises two gate electrode metal patterns, and the two gate electrode metal patterns are spaced apart and electrically connected to a same scan line, and simultaneously charge the first sub-gate electrode to increase the charging rate of the gate electrode. In addition, the first sub-gate electrode is preferably molybdenum, and the second sub-gate electrode is preferably aluminum or aluminum alloy. An impedance of aluminum is lower than that of molybdenum, which reduces the impedance of the gate electrode and further improves the charging rate of the gate electrode, so as to meet the requirements of resolution, refresh rate, and large size of high-definition display panels.

BRIEF DESCRIPTION OF THE SEVERAL VIEWS OF THE DRAWINGS

In order to explain the technical solutions in the embodiments or the prior art more clearly, the following will introduce briefly the drawings used in the description of the embodiments or the prior art. Obviously, the drawings in the following description are merely several embodiments of the present invention. For those skilled in the art, other drawings can be obtained based on these drawings without creative work.

DESCRIPTION OF SPECIFIC EMBODIMENTS OF THE INVENTION

Figure 1:
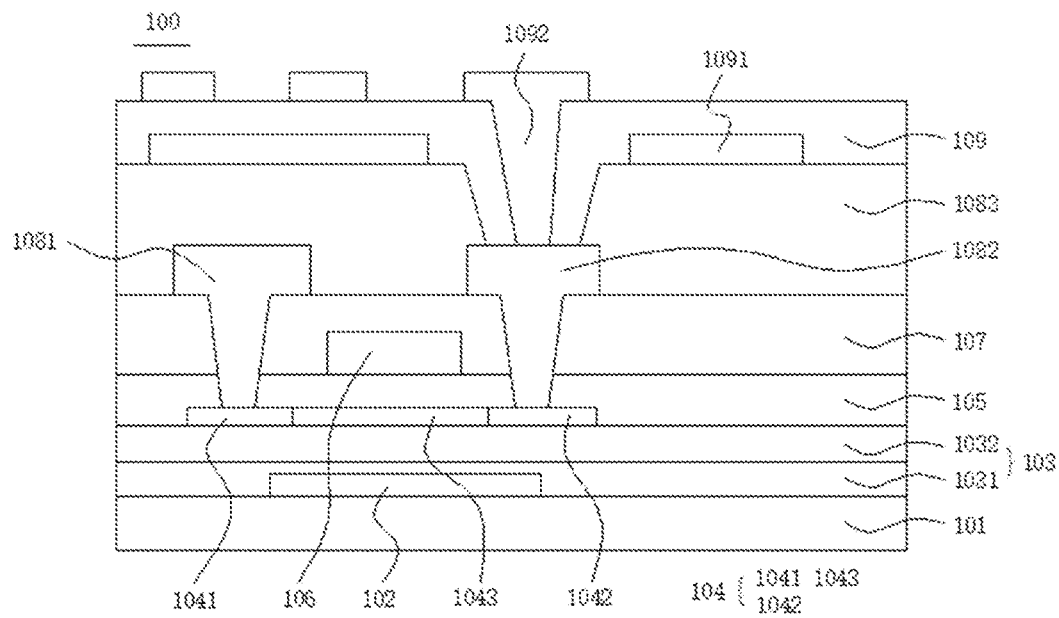
FIG. 1 is a schematic view of a structure of a thin film transistor (TFT) device in the prior art.

The following description of every embodiment with reference to the accompanying drawings is used to exemplify a specific embodiment which may be carried out in the present invention. The directional terms mentioned herein, such as "Up", "Down", "Front", "Back", "Left", "Right", "Inner", "Outer", "Side", etc., are for referring to the directions in the drawings. Therefore, the used directional terms are intended to illustrate, but not to limit, the present invention. In the drawings, units with similar structures are indicated by a same reference numeral. The dashed lines in the drawings indicate portions that do not exist in the structure, and only illustrate the shape and position of the structure.

The embodiments of the present invention are directed at the following technical problems in the prior art: increasing the thickness and width of the gate electrode in the top-gate thin film transistor (TFT) to improve charging rate can easily increase stress on the TFT films, which leads to a fragmentation of the films; the pixel aperture ratio limits the width of the gate electrode, and thus the width cannot keep increasing; in addition, the gate electrode is replaced with aluminum from molybdenum, and thus in the subsequent manufacturing process, a high temperature easily damages the aluminum gate electrode. The present invention can correct these defects.

In order to solve negative problems of changing the thickness and width of the gate electrode and replacing materials in a top-gate TFT to improve charging rate, embodiments of the present invention provide a TFT device. The TFT device at least comprises a light shield layer, an active layer, a gate electrode, a source electrode, and a drain electrode. The gate electrode comprises a first sub-gate electrode and a second sub-gate electrode. The second sub-gate electrode comprises two gate electrode metal patterns spaced apart. The first sub-gate electrode is located between the active layer, the source electrode, and the drain electrode, and it does not completely cover the channel region in the active layer. The second sub-gate electrode, the source electrode, and the drain electrode are disposed on a same layer and prepared in a same mask, which can save a mask. The second sub-gate is not affected by the opening of the pixel unit. In a film thickness direction of the TFT device, the first sub-gate electrode is located within the light shield layer, and materials of the first sub-gate electrode and the light shield layer are same. The source electrode and the source doped region are electrically connected through a source contact hole, and the drain electrode and the drain doped region are electrically connected through a drain contact hole.

The second sub-gate electrode is electrically connected to two end surfaces or side surfaces of the first sub-gate electrode, the material of the second sub-gate electrode is different from the material of the first sub-gate electrode, and the impedance of the second sub-gate electrode is much less than the impedance of the first sub-gate electrode. Thus, an impedance of an entire gate electrode is reduced. The two gate electrode metal patterns spaced apart in the second sub-gate electrode are electrically connected to a same scan line and simultaneously charge the first sub-gate electrode to improve charging rate and conductivity of the gate electrode, so that the first sub-gate is quickly attached with charges on a side near the active layer, and when the attached charges reach a certain amount, a corresponding electric field is generated to make electrons and holes in the channel region undergo directional movements, which realizes the requirements for resolution, refresh rate, and large size of high-definition display panels.

Figure 2:
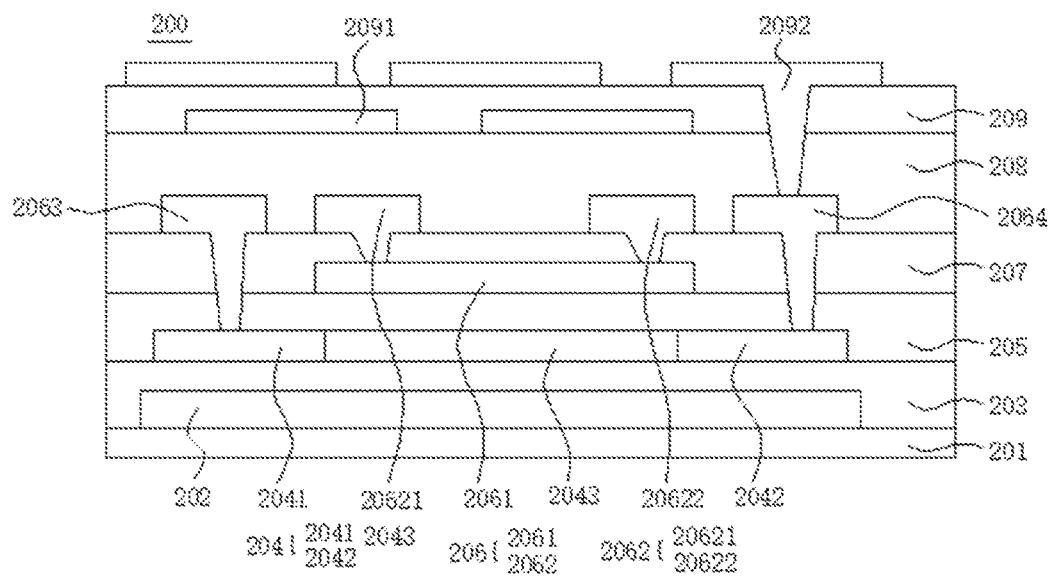
FIG. 2 is a schematic view of a first film structure of a TFT device in accordance with an embodiment of the present invention.
Figure 3:
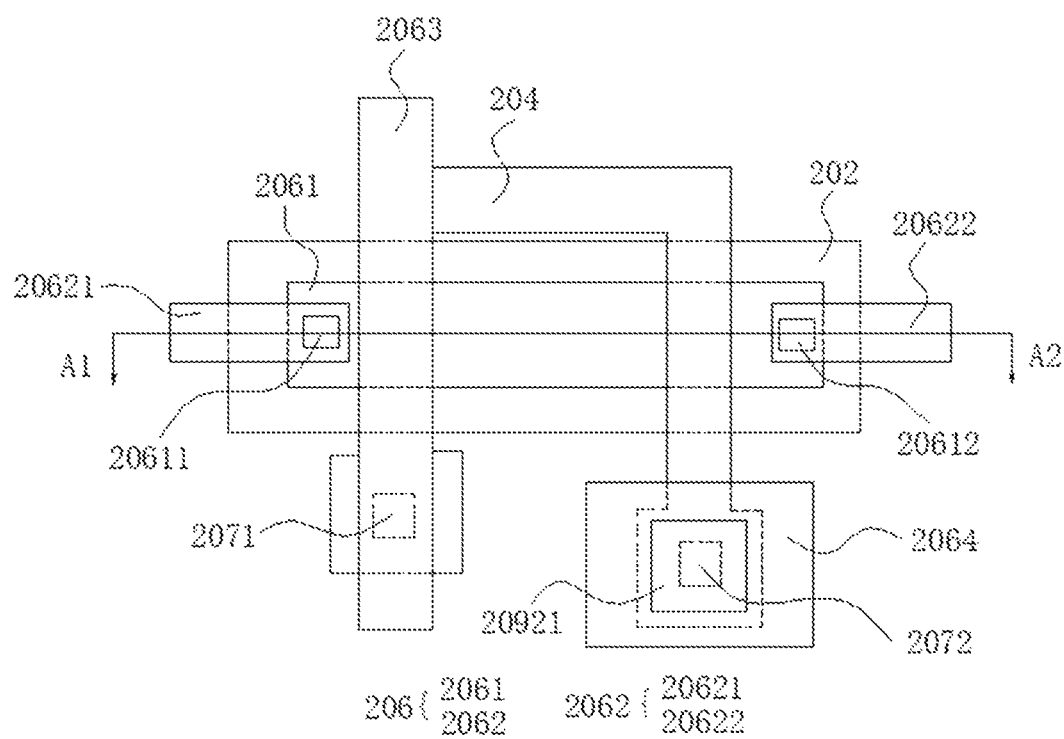
FIG. 3 is a schematic top view of a first structure of a TFT device in accordance with an embodiment of the present invention.
Figure 4:
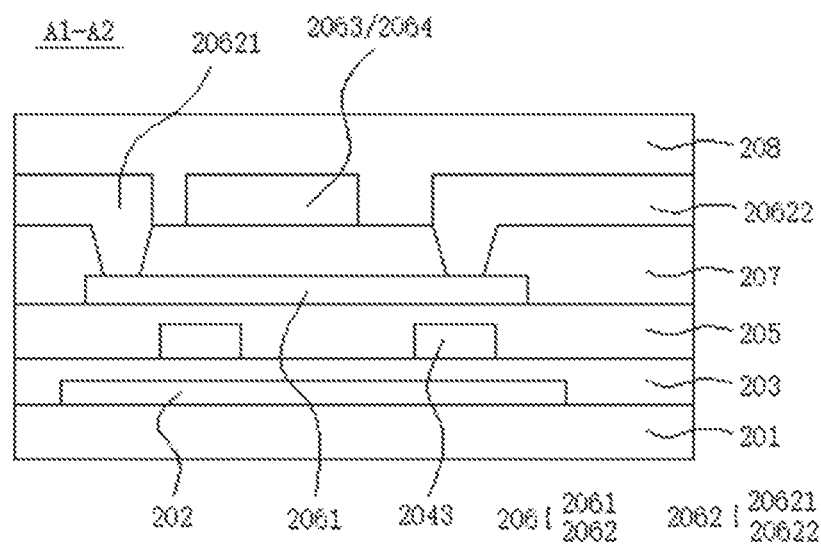
FIG. 4 is a schematic cross-sectional view along a line A1-A2 in the top view of the first structure of a TFT device in accordance with an embodiment of the present invention.

Specifically, as shown in FIGS. 2, 3, and 4, an embodiment of the present invention provides a schematic view of a first structure of a TFT device 200. The TFT device 200 is preferably a top-gate TFT device. The TFT device 200 comprises a substrate 201. A light shield layer 202 is disposed on the substrate 201, a buffer layer 203 covering the light shield layer 202 is disposed on the light shield layer 202, and an active layer 204 corresponding to an upward side of the light shield layer 202 is disposed on the buffer layer 203. A gate insulation layer 205 is disposed on the buffer layer 203, a first sub-gate electrode 2061 corresponding to an upward side of the active layer 204 is disposed on the gate insulation layer 205, and an interlayer insulation layer 207 is disposed on the gate insulation layer 205. A second sub-gate electrode 2062 corresponding to an upward side of the first sub-gate electrode 2061, a source electrode 2063, and a drain electrode 2064 are disposed on the interlayer insulation layer 207. A planarization layer 208 covering the second sub-gate electrode 2062, the source electrode 2063, and the drain electrode 2064 is disposed on the interlayer insulation layer 207. A common electrode 2091 and a passivation layer 209 covering the common electrode 2091 are disposed on a surface of the planarization layer 208, and a pixel electrode 2092 is disposed on the passivation layer 209. The material of the pixel electrode 2091 and the common electrode 2092 is indium tin oxide (ITO). The pixel electrode 2092 is electrically connected to the drain electrode 2064 through a pixel hole. Ends of a plurality of pixel electrodes 2092 are connected together to form a cohesive sensing electrode. Ends of a plurality of common electrodes 2091 are connected to form a cohesive driving electrode. The sensing electrode and the driving electrode are arranged in parallel or perpendicular to form an induction capacitor, and the induction capacitor generates a magnetic field, which affects and determines a deflection angle of a liquid crystal corresponding to an upward side of the TFT device 200.

The active layer 204 is a U-shape. The active layer 204 comprises a source doped region 2041, a drain doped region 2042, and a channel region 2043 located between the source doped region 2041 and the drain doped region 2042. In a film thickness direction of the TFT device, the source doped region 2041 and the drain doped region 2042 are disposed at two ends of the U-shape, and the first sub-gate electrode 2061 covers a middle portion of the U-shape and does not cover a lower portion of the U-shape. The source electrode 2063 overlaps one end of the U-shape, and the drain electrode 2064 overlaps another end of the U-shape. The second sub-gate electrode 2062 comprises a gate electrode metal pattern 20621 and a gate electrode metal pattern 20622 spaced apart. The gate insulation layer 205 and the interlayer insulation layer 207 are respectively provided with a source contact hole 2071 and a drain contact hole 2072 at positions corresponding to the source doped region 2041 and the drain doped region 2042. The interlayer insulation layer 207 is provided with a first via hole 20611 and a second via hole 20612 on both end surfaces of the first sub-gate electrode 2061. The source electrode 2063 is electrically connected to the source doped region 2041 by the source contact hole 2071, the drain electrode 2064 is electrically connected to the drain doped region 2042 by the drain contact hole 2072, the gate electrode metal pattern 20621 and the gate electrode metal pattern 20622 are respectively connected to a surface of the first sub-gate electrode 2061 through the first via hole 20611 and the second via hole 20612. The gate electrode metal pattern 20621, the gate electrode metal pattern 20622, the source electrode 2063, and the drain electrode 2064 are completed in a same mask, which saves one mask and reduce the production cost of the TFT device 200. The gate electrode metal pattern 20621 and the gate electrode metal pattern 20622 are not affected by the opening of the pixel unit of the liquid crystal panel to which the TFT device 200 is applied.

Figure 5:
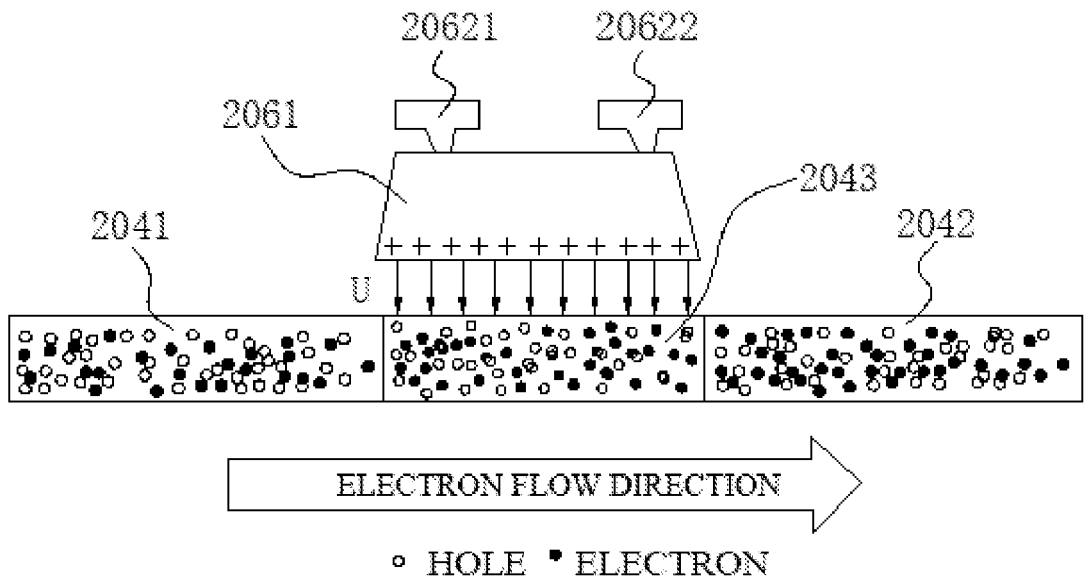
FIG. 5 is a schematic view of charge carrier flow direction in a channel region of a TFT device in accordance with an embodiment of the present invention.

As shown in FIG. 5, an embodiment of the present invention provides a schematic view of charge carrier flow direction in a channel region of a TFT device. The material of the active layer 204 is one or more semiconductor materials of indium gallium zinc oxide, indium zinc tin oxide, and indium gallium zinc tin oxide, and the semiconductor material contains two kinds of charge carriers (electrons and holes). When electrons and holes undergo directional movements under an action of electric field force, the semiconductor material generates current and transmits signals. The greater the electric field strength is, the wider the charge carrier migration speed is, and the faster the information transmission speed is. In this embodiment, the source doped region 2041 is electrically connected to the source electrode 2063, the source electrode 2063 is electrically connected to a data signal, the drain doped region 2042 is electrically connected to the drain electrode 2064, and the drain electrode 2064 is electrically connected to the pixel electrode. The first sub-gate electrode 2061 is disposed above the channel region 2043. Both ends of a surface of the first sub-gate electrode 2061 are electrically connected to the gate electrode metal pattern 20621 and the gate electrode metal pattern 20622, respectively. The gate electrode metal pattern 20621 and the gate electrode metal pattern 20622 are electrically connected to a same scan line. When the TFT device needs to be charged, the gate electrode metal pattern 20621 and the gate electrode metal pattern 20622 simultaneously apply a same voltage to the first sub-gate electrode 2061, and thus a surface of the first sub-gate electrode 2061 is quickly attached with positive charges, and the positive charges generate a potential difference U toward the channel region. The more positive charges, the greater the potential difference U. When the potential difference U exceeds the critical potential difference, electrons and holes in the channel region 2043 move, the electrons and holes moves in an opposite direction, and the data signal is transmitted to the pixel electrode through the channel region 2043 to drive the display of the liquid crystal panel related to the TFT device. The faster the potential difference U changes, the more it can meet the requirements for resolution, refresh rate and large size of the liquid crystal panel. In addition, in this embodiment, the first sub-gate electrode is made of one or more composite materials of molybdenum, copper, chromium, tungsten, tantalum, or titanium, and the second sub-gate electrode is aluminum or aluminum alloys. An impedance of aluminum is less than that of molybdenum, which further improves a conductivity of the first sub-gate electrode 2061 and reduces the impedance of the gate electrode 206, thereby improving charging rate of the gate electrode 206.

According to the schematic view of the first structure of the above mentioned TFT device 200, the applicant has also prevented other structures of TFT devices as shown in FIGS. 6-9.

Figure 6:
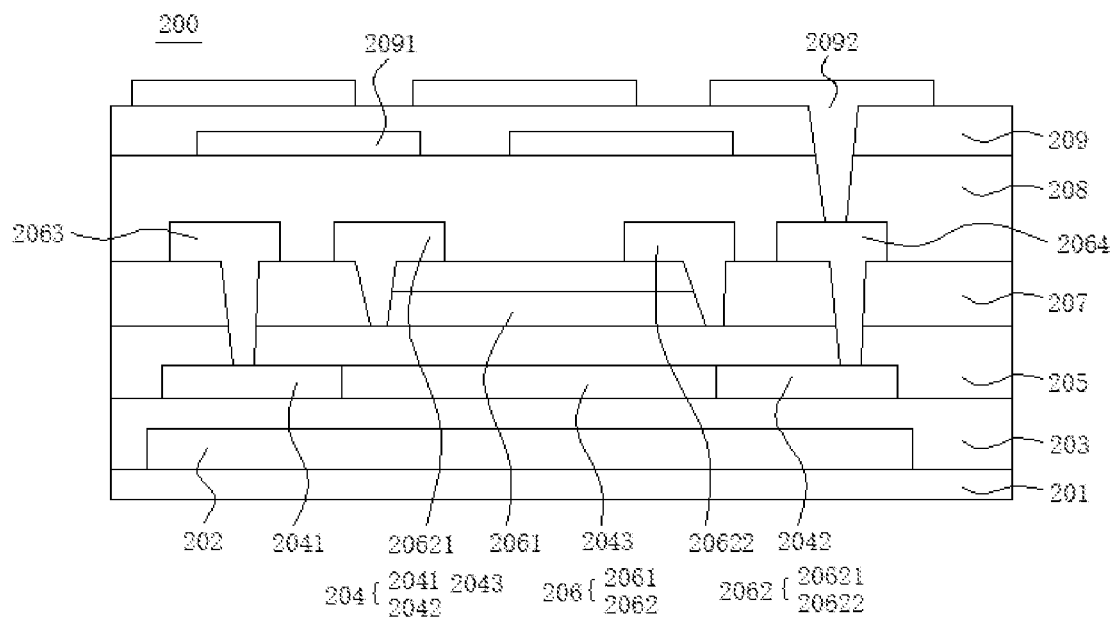
FIG. 6 is a schematic view of a second film structure of a TFT device in accordance with an embodiment of the present invention.

As shown in FIG. 6, an embodiment of the present invention provides a schematic view of a second structure of a TFT device 200. The gate electrode metal pattern 20621 and the gate electrode metal pattern 20622 are electrically connected to side surfaces of the first sub-gate electrode 2061 through the first via hole 20611 and the second via hole 20612, respectively. Other structures and reference numerals are the same as those in FIG. 2, and will not be repeated here.

Figure 7:
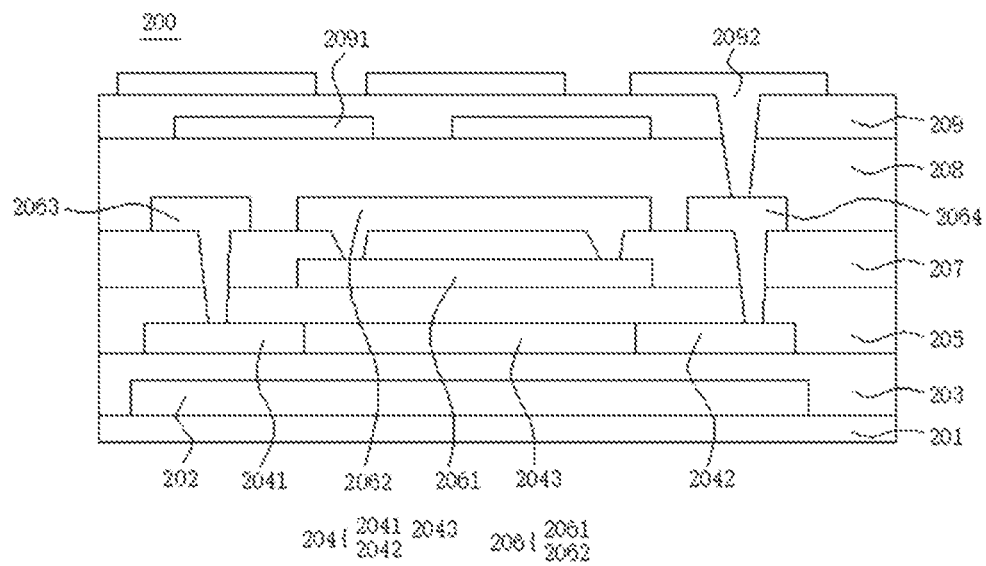
FIG. 7 is a schematic view of a third film structure of a TFT device in accordance with an embodiment of the present invention.

As shown in FIG. 7, an embodiment of the present invention provides a schematic view of a third structure of a TFT device 200. The second sub-gate electrode 2062 is a whole metal pattern, and the second sub-gate electrode 2062 is electrically connected to a surface of the first sub-gate electrode 2061 through a via hole defined in the interlayer insulation layer 207. Other structures and reference numerals are the same as those in FIG. 2, and will not be repeated here.

Figure 8:
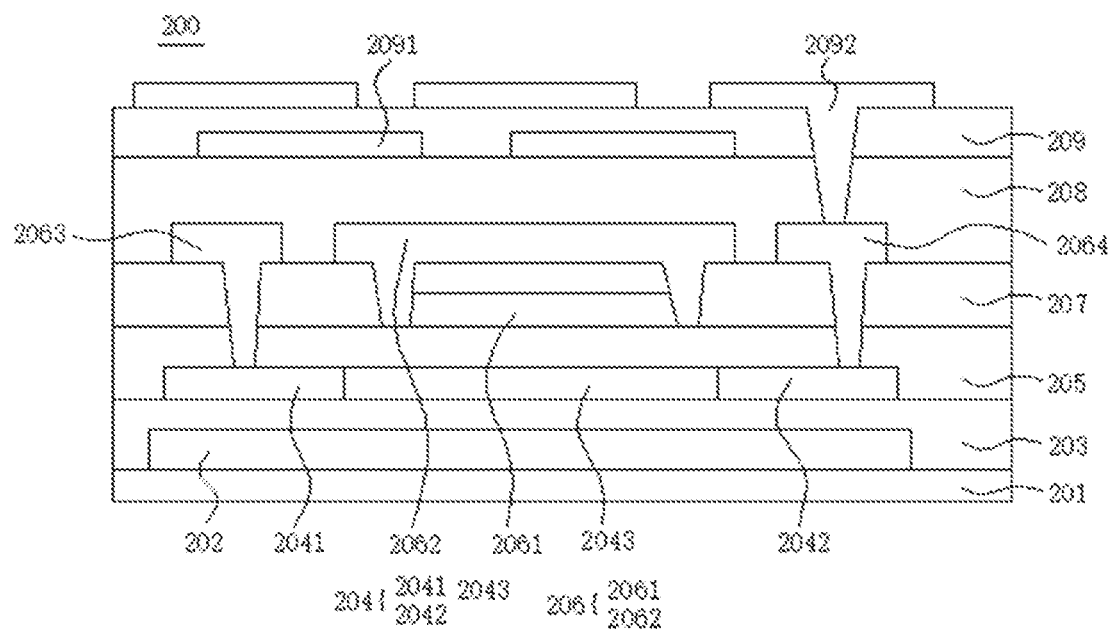
FIG. 8 is a schematic view of a fourth film structure of a TFT device in accordance with an embodiment of the present invention.

As shown in FIG. 8, an embodiment of the present invention provides a schematic view of a fourth structure of a TFT device 200. The second sub-gate electrode 2062 is a whole metal pattern, and the second sub-gate electrode 2062 is electrically connected to a side surface of the first sub-gate electrode 2061 by a via hole defined in the interlayer insulation layer 207. Other structures and reference numerals are the same as those in FIG. 2, and will not be repeated here.

Figure 9:
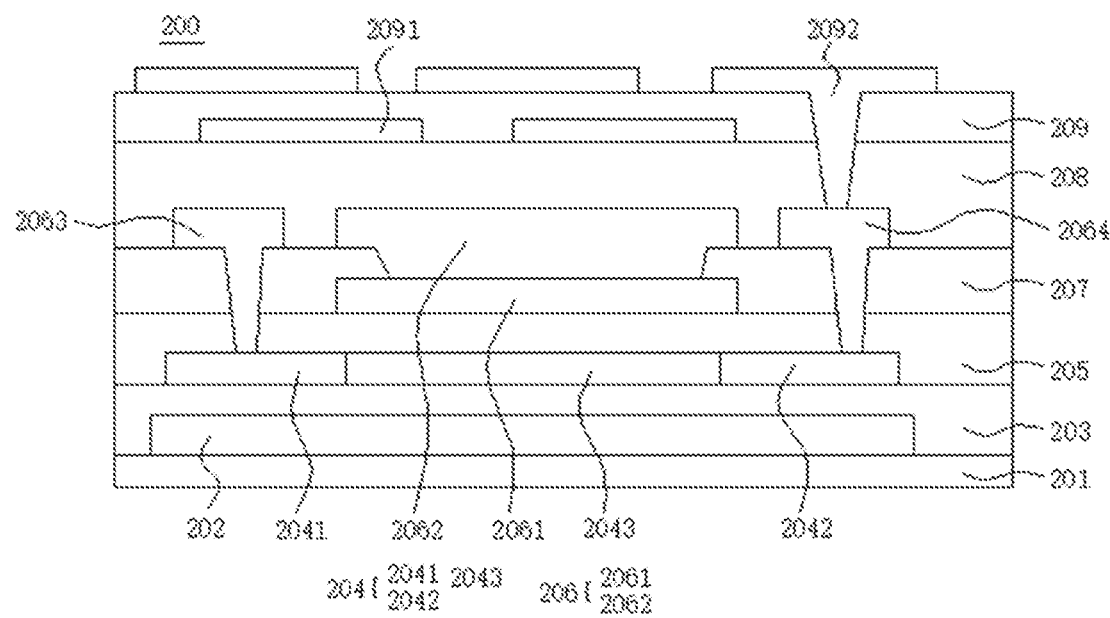
FIG. 9 is a schematic view of a fifth film structure of a TFT device in accordance with an embodiment of the present invention.

As shown in FIG. 9, an embodiment of the present invention provides a schematic view of a fifth structure of a TFT device 200. The second sub-gate electrode 2062 is a whole metal pattern, the second sub-gate electrode 2062 is attached to the first sub-gate electrode 2061, and the second sub-gate electrode 2062 is electrically connected to the first sub-gate electrode 2061 through a contact surface. Other structures and reference numerals are the same as those in FIG. 2, and will not be repeated here.

In the present invention, the second sub-gate electrode 2062 is not limited to the above mentioned positions. The second sub-gate electrode 2062 can also be disposed in a same layer as the common electrode 2091 or the pixel electrode 2092. Other specific structures are similar to those in FIG. 2 and will not be repeated here.

The applicant uses the first structure 200 of the TFT device in FIG. 2 as an example to provide a manufacturing method of a TFT device, the manufacturing method comprising steps of:

A step S10: providing a substrate, forming a light shield layer on the substrate, forming a buffer layer on the substrate, and forming an active layer corresponding to an upward side of the light shield layer on the buffer layer;

A step S20: forming a gate insulation layer on the buffer layer, forming a first sub-gate electrode corresponding to an upward side of the active layer on the gate insulation layer, forming an interlayer insulation layer on the gate insulation layer, and forming a second sub-gate electrode corresponding to an upward side of the first sub-gate electrode, a source electrode, and a drain electrode on the interlayer insulation layer, the first sub-gate electrode and the second sub-gate electrode are electrically connected.

Preferably, the step S20 specifically further includes: the second sub-gate electrode comprises two gate electrode metal patterns, and the two gate electrode metal patterns are spaced apart and electrically connected to the first sub-gate electrode by via holes in the interlayer insulation layer, the first sub-gate electrode is one or more composite materials of molybdenum, copper, chromium, tungsten, tantalum, or titanium, and the two gate electrode metal patterns are aluminum or aluminum alloys.

Figure 10:
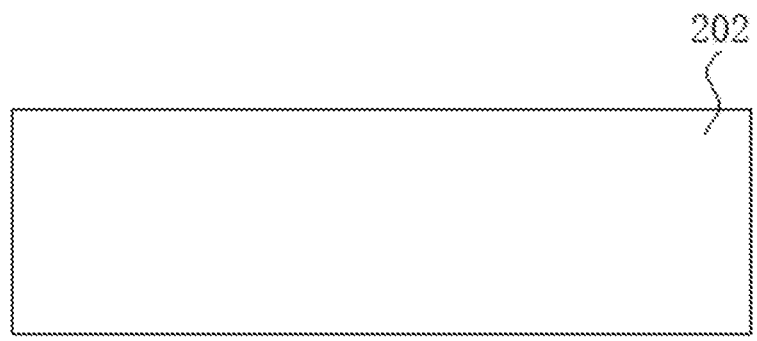
FIGS. 10, 11, 12, 13, 14 and 15 are schematic views of a manufacturing process of a first structure of a TFT device in accordance with an embodiment of the present invention.
Figure 11:
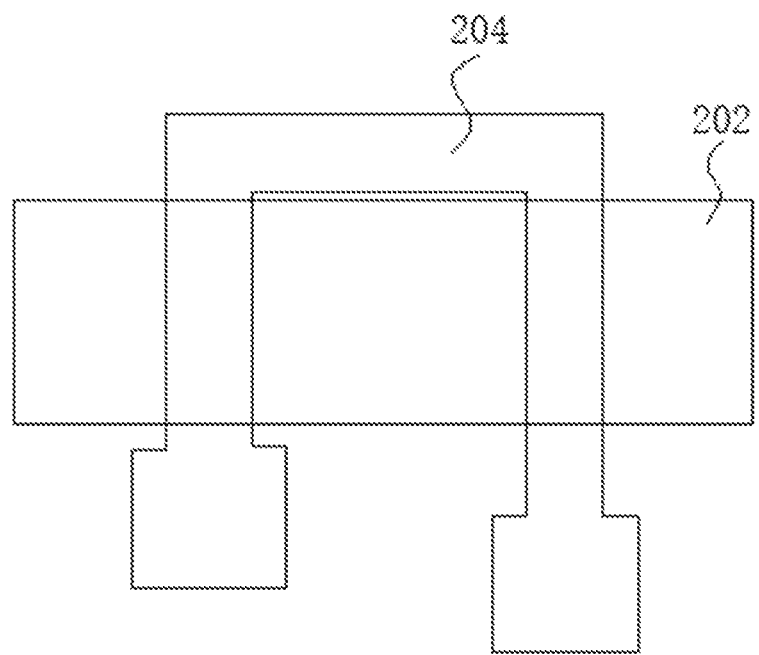
Figure 12:
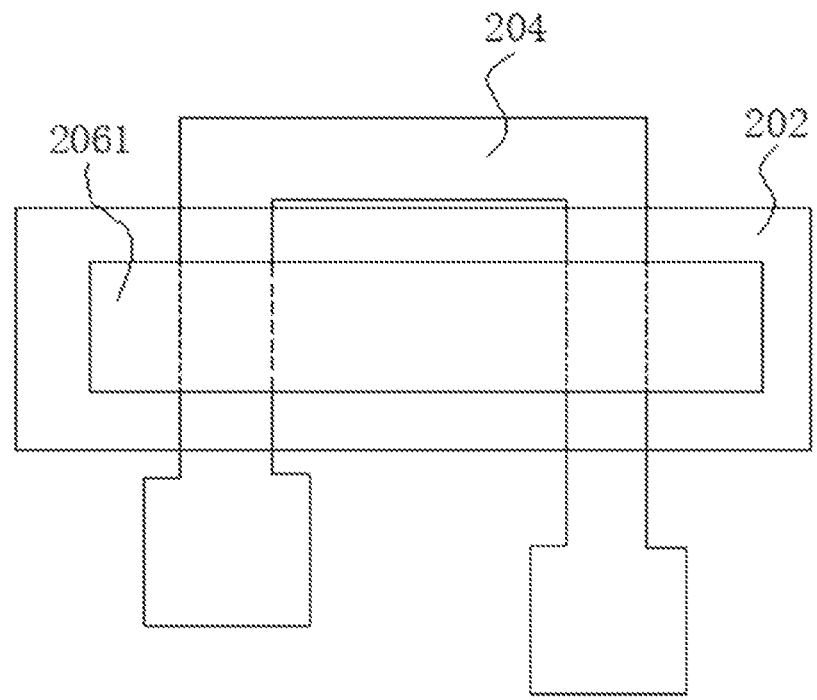

FIG. 2 shows a specific structure of the TFT device 200 in the manufacturing method. In order to better illustrate the application points, the applicant only draws partial structure diagrams in FIG. 10 to FIG. 15, and the structures and labels of the other films are same as those in FIG. 2 As shown in FIG. 10, the substrate 201 is usually a glass substrate, but can also be a substrate of other materials. There is no restriction herein. After the substrate 201 is cleaned with a cleaning solution such as pure water or hot sulfuric acid, a light shield layer 202 is formed on the substrate 201. A thickness of the light shield layer 202 is preferably in the range of 20 to 500 nm. The material of the light shield layer 101 is a metal, preferably one or more of molybdenum (Mo), aluminum (Al), copper (Cu), and titanium (Ti) or the alloys thereof. As shown in FIG. 11, a buffer layer 203 is formed on the light shield layer 202, and the buffer layer 203 covers the light shield layer 202. A thickness of the buffer layer 102 is preferably in the range of 50 to 100 nm. The buffer layer 203 is a silicon oxide (SiOx) film, a silicon nitride (SiNx) film, or a composite film formed by alternately laminating a silicon oxide film and a silicon nitride film. An active layer 204 corresponding to an upward side of the light shield layer 202 is formed on the buffer layer 203. The active layer 204 is etched to form a U-shaped semiconductor layer, which comprises a source doped region 2041, a drain doped region 2042, and a channel region 2043 between the source doped region 2041 and the drain doped region 2042. The material of the active layer 204 is one or more of indium gallium zinc oxide (IGZO), indium zinc tin oxide (IZTO), and indium gallium zinc tin oxide (IGZTO). As shown in FIG. 12, a gate insulation layer 205 is formed on the active layer 204 by a chemical vapor deposition method, and a first sub-gate electrode 2061 is formed on the gate insulation layer 205 by a physical vapor deposition method. Preferably, the first sub-gate electrode 2061 is one or more composite materials of molybdenum, copper, chromium, tungsten, tantalum, or titanium.

Figure 13:
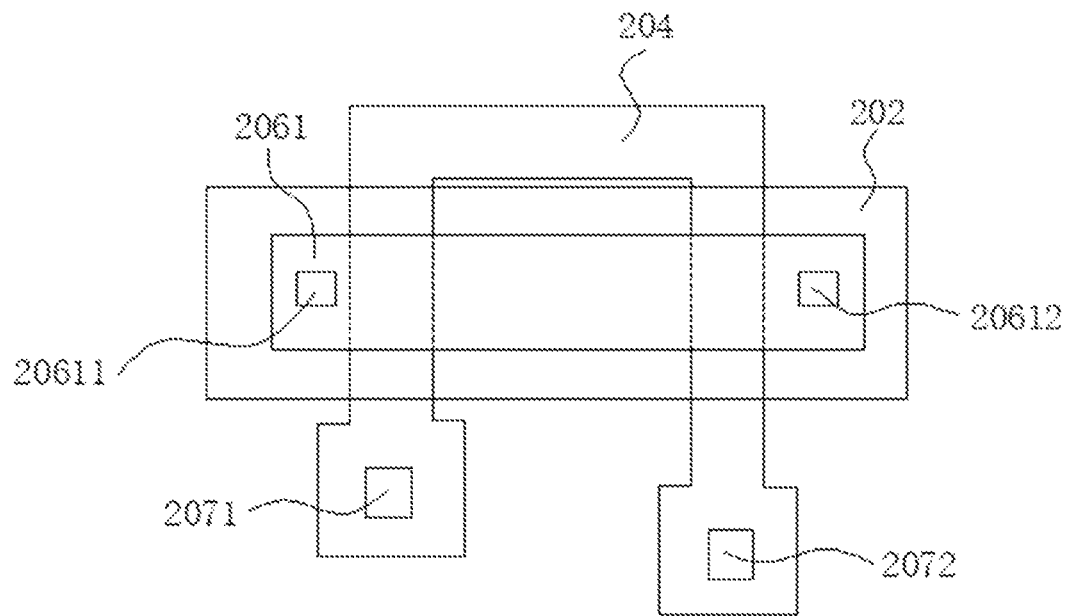
Figure 14:
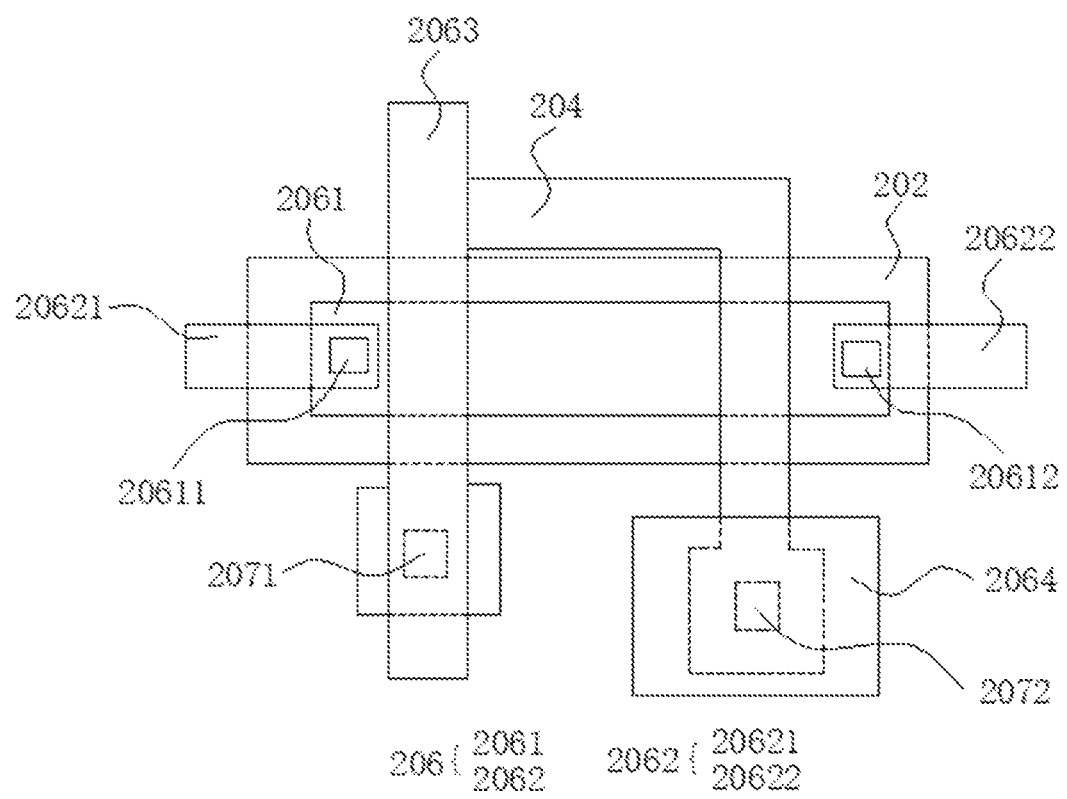
Figure 15:
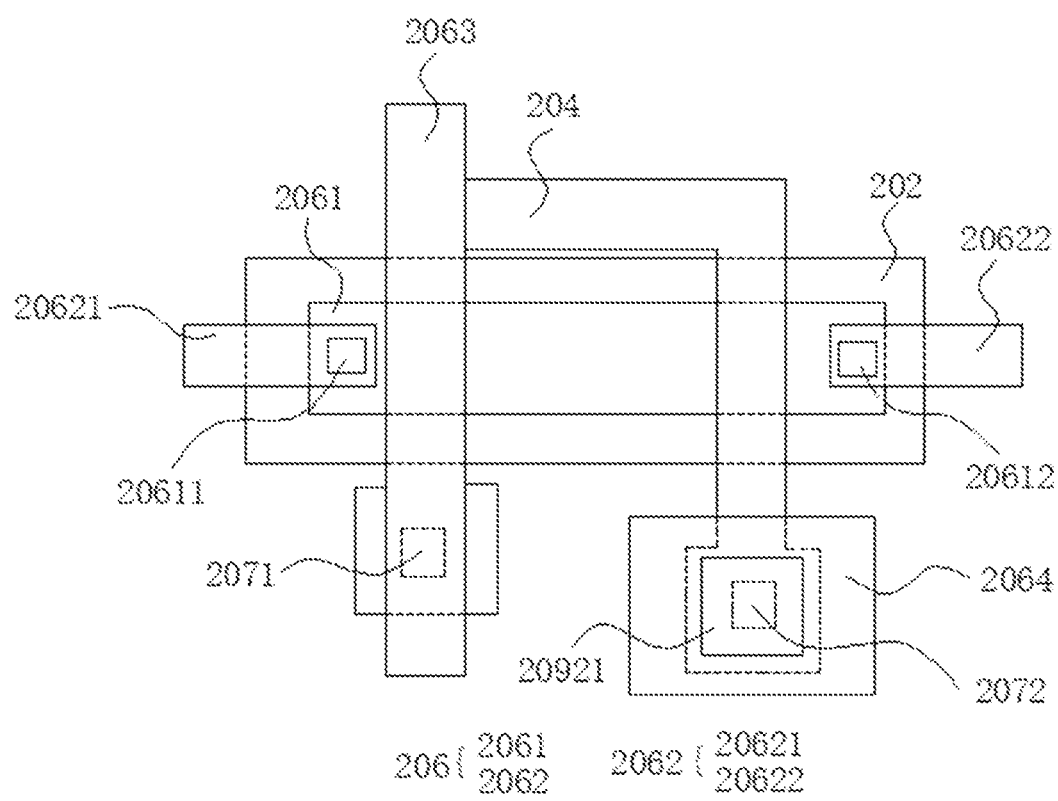

As shown in FIG. 13, an interlayer insulation layer 207 covering the first sub-gate electrode 2061 is formed on the gate insulation layer 205. The gate insulation layer 205 and the interlayer insulation layer 207 are respectively provided with a source contact hole 2071 and a drain contact hole 2072 at positions corresponding to the source doped region 2041 and the drain doped region 2042. The interlayer insulation layer 207 is provided with a first via hole 20611 and a second via hole 20612 on both end surfaces of the first sub-gate electrode 2061. As shown in FIG. 14, a second sub-gate electrode 2062, a source electrode 2063, and a drain electrode 2064 are formed on the interlayer insulation layer 207. The source electrode 2063 is electrically connected to the source doped region 2041 through the source contact hole 2071, and the drain electrode 2064 is electrically connected to the drain doped region 2042 through the drain contact hole 2072. The second sub-gate electrode 2062 comprises a gate electrode metal pattern 20621 and a gate electrode metal pattern 20622. The gate electrode metal pattern 20621 and the gate electrode metal pattern 20622 are respectively connected to a surface of the first sub-gate electrode 2061 through the first via hole 20611 and the second via hole 20612. The gate electrode metal pattern 20621, the gate electrode metal pattern 20622, the source electrode 2063, and the drain electrode 2064 are completed in a same mask. As shown in FIG. 15, a planarization layer 208 covering the second sub-gate electrode 2062, the source electrode 2063, and the drain electrode 2064 is formed on the interlayer insulation layer 207. A common electrode 2091 and a passivation layer 209 covering the common electrode 2091 are disposed on a surface of the planarization layer 208, a pixel electrode 2092 is disposed on the passivation layer 209. The material of the pixel electrode 2091 and the common electrode 2092 is ITO. The pixel electrode 2092 is electrically connected to the drain electrode 2064 through a pixel hole 20921.

According to the above TFT device, the applicant also provides an array substrate comprising the above TFT device.

The embodiments of the present invention provide a TFT device, a manufacturing method thereof, and an array substrate. The gate electrode comprises a first sub-gate electrode and a second sub-gate electrode disposed on different layers, the first sub-gate electrode is located between the active layer and the source electrode as well as the drain electrode in a film thickness direction of the TFT device, the second sub-gate electrode, the source electrode, and the drain electrode are disposed on a same layer, and prepared in a same mask, which can save a mask. The second sub-gate is not affected by the opening of the pixel unit. The second sub-gate electrode comprises two gate electrode metal patterns, the two gate electrode metal patterns are spaced apart and electrically connected to a same scan line, and simultaneously charge the first sub-gate electrode to increase charging rate of the gate electrode. In addition, the first sub-gate electrode is preferably molybdenum, and the second sub-gate electrode is preferably aluminum or aluminum alloy. The impedance of aluminum is less than that of molybdenum, which reduces the impedance of the gate electrode and further improves charging rate of the gate electrode, so as to meet the requirements for resolution, refresh rate, and large size of high-definition display panels.

In summary, although the present invention has been disclosed in the above preferred embodiments, the above preferred embodiments do not intend to limit the present invention. Various modifications and changes can be made by those skilled in the art without departing from the spirit and scope of the present invention. Therefore, the scope of protection of the present invention is subject to the scope defined by the claims.

What is claimed is:

1. A thin film transistor (TFT) device, at least comprising a light shield layer, an active layer, a gate electrode, a source electrode, and a drain electrode,
   wherein the gate electrode comprises a first sub-gate electrode and a second sub-gate electrode disposed respectively on different layers; the first sub-gate electrode is defined between the active layer, the source electrode, and the drain electrode in a film thickness direction of the TFT device; the second sub-gate electrode, the source electrode, and the drain electrode are disposed on a same layer; and the first sub-gate electrode and the second sub-gate electrode are electrically connected;
   the active layer is of a U-shape; and
   the second sub-gate electrode comprises two gate electrode metal patterns, and the two gate electrode metal patterns are spaced apart and disposed respectively on two sides of the U-shape.

2. The TFT device as claimed in claim 1, wherein the active layer comprises a source doped region, a drain doped region, and a channel region defined between the source doped region and the drain doped region; the source doped region and the drain doped region are disposed at two ends of the U-shape; and the first sub-gate electrode covers a middle portion of the U-shape and does not cover a lower portion of the U-shape.

3. The TFT device as claimed in claim 2, wherein in the film thickness direction of the TFT device, the source electrode overlaps one end of the U-shape, the drain electrode overlaps another end of the U-shape, the source electrode and the source doped region are electrically connected through a source contact hole, and the drain electrode and the drain doped region are electrically connected through a drain contact hole.

4. The TFT device as claimed in claim 3, wherein each of the two gate electrode metal patterns is electrically connected to a surface or a side surface of the first sub-gate electrode through a via hole.

5. The TFT device as claimed in claim 1, wherein the two gate electrode metal patterns are electrically connected to a same scan line through via holes and simultaneously charge the first sub-gate electrode, and when a side of the first sub-gate electrode near the active layer is attached with a preset charge, the preset charge generates a preset electric field to drive electrons and holes in the channel region to move along preset directions.

6. The TFT device as claimed in claim 1, wherein the first sub-gate electrode comprises one or more composite materials of molybdenum, copper, chromium, tungsten, tantalum, or titanium, and the second sub-gate electrode comprises aluminum or an aluminum alloy.

7. The TFT device as claimed in claim 1, wherein in the film thickness direction of the TFT device, the first sub-gate electrode is defined within the light shield layer, and materials of the first sub-gate electrode and the light shield layer are same.

8. The TFT device as claimed in claim 1, wherein a planarization layer is disposed on the source electrode and the drain electrode, a common electrode and a passivation layer covering the common electrode are disposed on a surface of the planarization layer, a pixel electrode is disposed on a surface of the passivation layer, and the pixel electrode is electrically connected to the drain electrode through a pixel hole.

9. The TFT device as claimed in claim 8, wherein the second sub-gate electrode is disposed on a same layer as the common electrode or the pixel electrode.

10. A manufacturing method of a thin film transistor (TFT) device, comprising:
    providing a substrate, forming a light shield layer on the substrate, forming a buffer layer on the substrate, and forming an active layer of a U-shape corresponding to an upward side of the light shield layer on the buffer layer; and
    forming a gate insulation layer on the buffer layer, forming a first sub-gate electrode corresponding to an upward side of the active layer on the gate insulation layer, forming an interlayer insulation layer on the gate insulation layer, and forming a second sub-gate electrode corresponding to an upward side of the first sub-gate electrode, a source electrode, and a drain electrode on the interlayer insulation layer, wherein the first sub-gate electrode and the second sub-gate electrode are electrically connected, the second sub-gate electrode comprises two gate electrode metal patterns, and the two gate electrode metal patterns are spaced apart and disposed respectively on two sides of the U-shape.

11. The manufacturing method of the TFT device as claimed in claim 10,
    wherein the two gate electrode metal patterns are electrically connected to the first sub-gate electrode respectively through via holes in the interlayer insulation layer, the first sub-gate electrode comprises one or more composite materials of molybdenum, copper, chromium, tungsten, tantalum, or titanium, and the two gate electrode metal patterns comprise aluminum or aluminum alloys.

12. An array substrate, comprising a thin film transistor (TFT) device, wherein the TFT device at least comprises a light shield layer, an active layer, a gate electrode, a source electrode, and a drain electrode,
wherein the gate electrode comprises a first sub-gate electrode and a second sub-gate electrode disposed respectively on different layers; the first sub-gate electrode is defined between the active layer, the source electrode, and the drain electrode in a film thickness direction of the TFT device; the second sub-gate electrode, the source electrode, and the drain electrode are disposed on a same layer; and the first sub-gate electrode and the second sub-gate electrode are electrically connected;
the active layer is of a U-shape; the active layer comprises a source doped region, a drain doped region, and a channel region defined between the source doped region and the drain doped region; the source doped region and the drain doped region are disposed at two ends of the U-shape; and the first sub-gate electrode covers a middle portion of the U-shape and does not cover a lower portion of the U-shape; and
the second sub-gate electrode comprises two gate electrode metal patterns, and the two gate electrode metal patterns are spaced apart and disposed respectively on two sides of the U-shape.

13. The array substrate as claimed in claim 12, wherein in the film thickness direction of the TFT device, the source electrode overlaps one end of the U-shape, the drain electrode overlaps another end of the U-shape, the source electrode and the source doped region are electrically connected through a source contact hole, and the drain electrode and the drain doped region are electrically connected through a drain contact hole.

14. The array substrate as claimed in claim 13, wherein each of the two gate electrode metal patterns is electrically connected to a surface or a side surface of the first sub-gate electrode through a via hole.

15. The array substrate as claimed in claim 12, wherein the two gate electrode metal patterns are electrically connected to a same scan line through via holes and simultaneously charge the first sub-gate electrode, and when a side of the first sub-gate electrode near the active layer is attached with a preset charge, the preset charge generates a preset electric field to drive electrons and holes in the channel region to move along preset directions.

16. The array substrate as claimed in claim 12, wherein the first sub-gate electrode comprises one or more composite materials of molybdenum, copper, chromium, tungsten, tantalum, or titanium, and the second sub-gate electrode comprises aluminum or an aluminum alloy.

17. The array substrate as claimed in claim 12, wherein in the film thickness direction of the TFT device, the first sub-gate electrode is defined within the light shield layer, and materials of the first sub-gate electrode and the light shield layer are same.

18. The array substrate as claimed in claim 12, wherein a planarization layer is disposed on the source electrode and the drain electrode, a common electrode and a passivation layer covering the common electrode are disposed on a surface of the planarization layer, a pixel electrode is disposed on a surface of the passivation layer, and the pixel electrode is electrically connected to the drain electrode through a pixel hole.

* * * * *